(12) United States Patent
Eder et al.

(10) Patent No.: US 10,736,249 B2
(45) Date of Patent: Aug. 4, 2020

(54) CONDUCTIVE CORONA SHIELDING PAPER, IN PARTICULAR FOR OUTER CORONA SHIELDING

(71) Applicant: Siemens Aktiengesellschaft, Munich (DE)

(72) Inventors: Florian Eder, Erlangen (DE); Bernhard Klaussner, Nuremberg (DE); Jiri Lang, Nuremberg (DE); Steffen Lang, Hallendorf (DE); Alexander Litinsky, Muelheim (DE); Guido Schmidt, Leichlingen (DE); Christian Schulz-Drost, Nuremberg-Nuenhof (DE); Klaus Schaefer, Nuremberg (DE); Christian Staubach, Marl (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 700 days.

(21) Appl. No.: 15/122,254

(22) PCT Filed: Feb. 26, 2015

(86) PCT No.: PCT/EP2015/054070
§ 371 (c)(1),
(2) Date: Aug. 29, 2016

(87) PCT Pub. No.: WO2015/128432
PCT Pub. Date: Sep. 3, 2015

(65) Prior Publication Data
US 2016/0374236 A1    Dec. 22, 2016

(30) Foreign Application Priority Data

Feb. 28, 2014    (DE) .................. 10 2014 203 744

(51) Int. Cl.
*H02K 3/30* (2006.01)
*H05K 9/00* (2006.01)
(Continued)

(52) U.S. Cl.
CPC ............ *H05K 9/0073* (2013.01); *H01B 3/52* (2013.01); *H01B 7/292* (2013.01); *H02K 3/30* (2013.01); *H02K 3/40* (2013.01)

(58) Field of Classification Search
CPC .................................. H02K 3/30; H02K 3/40
See application file for complete search history.

(56) References Cited

U.S. PATENT DOCUMENTS 4,207,482 A    6/1980  Neumeyer et al. ............. 310/45
4,760,296 A *  7/1988  Johnston ................... C08K 3/36
                                                    174/127

(Continued)

FOREIGN PATENT DOCUMENTS

CN    1266534 A    9/2000  ............... H01C 7/10
CN    1992100 A    7/2007
(Continued)

OTHER PUBLICATIONS

Chinese Office Action, Application No. 201580010406.0, 8 pages, dated Sep. 18, 2018
(Continued)

*Primary Examiner* — Dang D Le
(74) *Attorney, Agent, or Firm* — Slayden Grubert Beard PLLC

(57) ABSTRACT

A corona shielding paper for use in a corona shielding system for an electric machine, e.g. a high-voltage machine, may be produced by compacting partial discharge-resistant, planar, conductive particles but can include both reinforcement fibers and a woven fabric.

19 Claims, 1 Drawing Sheet

(51) Int. Cl.
*H01B 3/52* (2006.01)
*H02K 3/40* (2006.01)
*H01B 7/29* (2006.01)

(56) References Cited

U.S. PATENT DOCUMENTS

| | | | |
|---|---|---|---|
| 5,723,920 A | 3/1998 | Markovitz et al. | 310/45 |
| 6,043,582 A | 3/2000 | Markovitz et al. | 310/213 |
| 6,469,611 B1 | 10/2002 | Kluge-Weiss et al. | 338/20 |
| 2005/0048209 A1 | 3/2005 | Drappel | 427/372.2 |
| 2005/0194551 A1* | 9/2005 | Klaussner | H02K 3/40 |
| | | | 250/505.1 |
| 2006/0097600 A1 | 5/2006 | Baumann | 310/196 |
| 2006/0266488 A1 | 11/2006 | Doherty et al. | 162/164.1 |
| 2007/0114704 A1* | 5/2007 | Stevens | D21H 13/44 |
| | | | 264/643 |
| 2007/0117911 A1 | 5/2007 | Irwin et al. | 524/495 |
| 2007/0149073 A1* | 6/2007 | Klaussner | H02K 3/40 |
| | | | 442/59 |
| 2008/0179077 A1 | 7/2008 | Krivda et al. | 174/152 R |
| 2008/0284262 A1 | 11/2008 | Nelson et al. | 310/52 |
| 2012/0286825 A1 | 11/2012 | Baus et al. | 327/39 |
| 2013/0260139 A1 | 10/2013 | Kamada et al. | 428/328 |
| 2014/0083592 A1 | 3/2014 | Gröppel et al. | 428/328 |
| 2014/0246628 A1* | 9/2014 | Anhalt | C08K 7/00 |
| | | | 252/500 |

FOREIGN PATENT DOCUMENTS

| | | | |
|---|---|---|---|
| CN | 101189686 A | 5/2008 | H01B 3/08 |
| CN | 101253582 A | 8/2008 | H01B 17/28 |
| CN | 103029395 A | 4/2013 | B32B 27/18 |
| CN | 103400638 A | 11/2013 | C09J 11/04 |
| DE | 102010000962 A1 | 7/2011 | G06F 1/04 |
| DE | 102010009462 A1 | 9/2011 | |
| DE | 102010032949 A1 | 2/2012 | |
| DE | 102011075425 A1 | 11/2012 | |
| EP | 2362399 A1 | 8/2011 | |
| GB | 1169946 A | 11/1969 | C09J 7/02 |
| JP | 58190246 A | 11/1983 | H02K 3/40 |
| JP | 61177134 A | 8/1986 | H02K 3/40 |
| JP | 6277040 A | 4/1987 | H02K 15/12 |
| JP | 1028345 A | 1/1998 | H02K 15/12 |
| JP | 2005080468 A | 3/2005 | H02K 3/34 |
| JP | 2007174816 A | 7/2007 | H02K 15/10 |
| JP | 2011223874 A | 11/2011 | H02K 3/40 |
| SU | 553322 A1 | 4/1977 | D21H 23/00 |
| WO | 03/107512 A1 | 12/2003 | |
| WO | 2005/124790 A2 | 12/2005 | |
| WO | 2006/118536 A1 | 11/2006 | H01B 3/08 |
| WO | 2012/152262 A1 | 11/2012 | |
| WO | 2015/128367 A1 | 9/2015 | |
| WO | 2015/128432 A1 | 9/2015 | |

OTHER PUBLICATIONS

Japanese Office Action, Application No. 2016554459, 3 pages, dated Oct. 2, 2017
Chinese Office Action, Application No. 201580010152.2, 12 pages, dated Mar. 1, 2017.
International Search Report and Written Opinion, Application No. PCT/EP2015/054070, 22 pages, dated May 18, 2015.
International Search Report and Written Opinion, Application No. PCT/EP2015/05311, 10 pages, dated Jun. 22, 2015.
Russian Office Action, Application No. 2016134746/07, 9 pages, dated Dec. 5, 2017
U.S. Final Office Action, U.S. Appl. No. 15/122,271, 9 pages, dated Mar. 18, 2019.
U.S. Non-Final Office Action, U.S. Appl. No. 15/122,271, 26 pages, dated Aug. 2, 2018.
Chinese Office Action, Application No. 201580010406.0, 6 pages, dated Jan. 17, 2018.
Indian Office Action, Application No. 201617025340, 5 pages, dated Feb. 13, 2019.

* cited by examiner

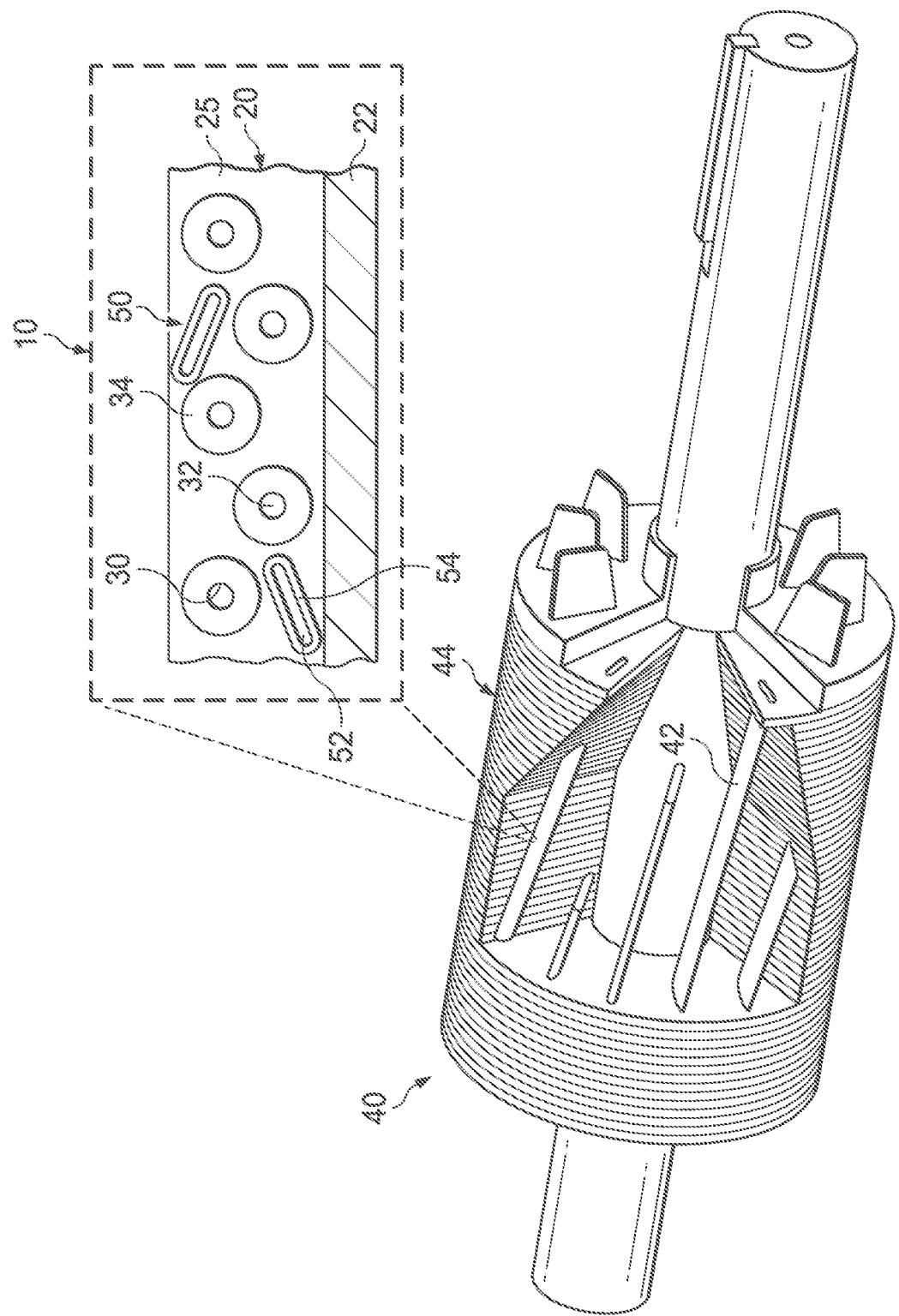

CONDUCTIVE CORONA SHIELDING PAPER, IN PARTICULAR FOR OUTER
CORONA SHIELDING

CROSS-REFERENCE TO RELATED APPLICATIONS

This application is a U.S. National Stage Application of International Application No. PCT/EP2015/054070 filed Feb. 26, 2015, which designates the United States of America, and claims priority to DE Application No. 10 2014 203 744.1 filed Feb. 28, 2014, the contents of which are hereby incorporated by reference in their entirety.

TECHNICAL FIELD

The invention relates to a conductive corona shielding paper for use in a corona shielding system for an electrical machine, for example a high-voltage machine, such as a generator for generating electrical energy or an electric motor, but also other electrical equipment with a higher rated voltage such as transformers, bushings, cables, etc.

BACKGROUND

Ever more powerful machines, such as for example generators, are being developed, because advancing technology demands ever higher power densities. A powerful generator, such as for example a turbo generator, has in particular a stator with a laminated stator core and a plurality of generator slots in which the generator winding is located.

The main insulation of this winding with respect to the laminated core is a system that is subjected to great electrical loading.

High voltages occur during operation and have to be brought down in the insulating volume between the conductor bar, which is under a high voltage, and the laminated core, which is at ground potential. Increases in the field thereby occur at the edges of the sheets in the laminated core, which for their part cause partial discharges. When they meet the insulating system, these partial discharges lead locally to very intense overheating. In this case, the organic materials of the insulating system, including those of the outer corona shielding system, are successively broken down into low-molecular, volatile products, for example $CO_2$.

An important component part of the insulating system is the so-called outer corona shielding (OCS). In the case of relatively large generators and electric motors, it is applied directly to the surface of the winding insulation. The OCS currently consists of corona shielding papers containing carbon black and graphite.

Because, for system-related reasons, the interface between the OCS and the main insulation especially cannot be produced completely without pores, correspondingly high electrical field intensities in the insulating system cause correspondingly high electrical partial discharge activity, which during operation completely incinerates the outer corona shielding over time and consequently leads to premature aging of the insulation and in the worst case to a ground fault of the electrical machine. This corresponds to an irreparable complete failure of the machine.

The outer corona shielding must have a certain square resistance, which lies in a certain range. If it is too low, the laminated cores may be electrically shorted, which can lead to high induced circulating currents, which are manifested over the ends of the laminated core and the outer corona shielding and lead to high-current arcs. If the resistance is too high, high-voltage spark erosion may in turn occur. It would be ideal if the resistance in the outer corona shielding system could be set, so that it would be possible to establish an anisotropy that displays increased conductivity in the radial direction, that is to say from the current-carrying conductor to the laminated core, and increased resistance, that is to say low conductivity, in the direction of the bar.

SUMMARY

One embodiment provides a corona shielding paper, comprising planar and electrically conductively coated particles, with globular particles also admixed with the planar particles for selective setting of an anisotropic electrical conductivity.

In one embodiment, the particles have a core that is resistant to partial discharges and a coating that is resistant to partial discharges and is conductive.

In one embodiment, reinforcing fibers are also contained in the corona shielding paper.

In one embodiment, the reinforcing fibers have an organic or inorganic basis.

In one embodiment, a woven fabric is also contained in the corona shielding paper for stabilization and as a carrier.

In one embodiment, the particles are coated with a metal oxide.

In one embodiment, the particles are coated with a doped metal oxide.

BRIEF DESCRIPTION OF THE DRAWING

The single FIGURE shows an example corona shielding installed on an electrical machine incorporating teachings of the present disclosure.

DETAILED DESCRIPTION

Embodiments of the present invention provide a corona shielding paper that is resistant to partial discharges and is electrically conductive.

Some embodiments provide corona shielding paper, comprising planar and electrically conductively coated particles, with globular particles also admixed with the planar particles for selective setting of the electrical conductivity.

According to one embodiment, reinforcing fibers are also added to the corona shielding paper.

According to a further embodiment, the production of the corona shielding paper involves presenting a woven fabric, around which and/or in the meshes of which the corona shielding paper forms. Depending on the size of the meshes, the woven fabric may contain corona shielding paper with or without reinforcing fibers. In any event, if a woven fabric is present, the amount of reinforcing fibers required for stabilizing the paper is reduced correspondingly.

In the production of corona shielding paper, the platelet-like and conductively coated particles are arranged in the manner of layers, so that the particles arrange themselves largely parallel to one another, particles that are lying directly on top of one another overlapping to form contact surfaces. As a consequence of van der Waals forces and hydrogen bridge bonds, interactions that give the corona shielding paper a high mechanical load-bearing capacity, and consequently a stable form, form between the contact surfaces. The following known processes can be used for example for the production of the corona shielding paper: cylinder-mold and fourdrinier processes.

To improve the mechanical properties (for example strength, processability, etc.), organically or inorganically based fibers are also added for example to the corona shielding paper. Organic fibers may be represented for example by meta-/para-aramid or polyester (PET). Inorganic fibers may be for example glass fibers.

In one embodiment, the dimensions of the fibers with respect to the diameter lie in the nanometer range, that is to say for example at 1 to 500 nm, and/or in the µm range as 0.5 to 10 µm. The length of the fibers is always greater by orders of magnitude, for example in the mm range, up to the, preferably single-digit, cm range.

According to one embodiment, the corona shielding paper is reinforced by a woven fabric and/or fibers, then also resulting for example in a corona shielding tape. The method for producing the corona shielding tape comprises for example the following process steps: mixing a dispersion, which comprises planar particles that are resistant to partial discharges and electrically conductive with a carrier fluid; producing a sediment by sedimentation of the dispersion, the planar particles being arranged in a substantially layer-like plane-parallel manner in the sediment; introducing a woven fabric into the sediment and removing the carrier fluid from the sediment.

According to one embodiment, the woven fabric takes a network-like form, so that in the network structure there are meshes, which can be filled with corona shielding paper. For example, there forms—also—within the meshes a region with corona shielding paper.

According to one embodiment, the particle composite comprises platelet-like and spherical particles, the platelet-like particles particularly preferably having an aspect ratio of at least 10, that is to say a ratio of platelet length to platelet thickness of at least 10.

The particles preferably comprise a core that is resistant to partial discharges and a coating that is resistant to partial discharges and is conductive.

The term "resistant to partial discharges" relates here to materials which—for example—are resistant to oxidation when there are partial discharges in air or which otherwise remain stable when there are partial discharges, such as ceramics and/or glasses.

According to one embodiment, the core that is resistant to partial discharges is of a ceramic or glass-like material, which preferably has a low density and is preferably mica, silica flour, alumina or glass platelets.

With a planar structure of the particles, improved contacting of the conductive particles with respect to one another is achieved. It is preferred that the material coating the particles is a metal oxide and is selected from the group comprising tin oxide, zinc oxide, zinc stannate, titanium dioxide, lead oxide or non-oxidic silicon carbide. The doping element is preferably selected from the group: antimony, indium and cadmium.

In the production of the insulation, the corona shielding paper is wound around the conductor to be insulated and impregnated with a resin. Subsequently, the composite comprising the resin and the corona shielding paper is cured. In addition or as an alternative, the corona shielding paper may be applied to a backing fabric of glass, plastic such as polyester and/or PET, a woven fabric as the backing lending the corona shielding paper additional stability. An adhesive or a polymeric matrix bonds the woven fabric, if provided, and the corona shielding paper to form a mica tape.

One aspect of some embodiments is the mixing of spherical and planar particles. It is known from DE 102010009462.5 that planar platelet-like particles are used for the production of the outer corona shielding, particles which by their alignment during the production process and their conductive coating create conductivity paths, along which the conductivity is high and the resistance is low. A disadvantage of this is that the conductivity perpendicular thereto, that is to say in the radial direction, where the platelet-like particles only have a very small extent, is quite low. As mentioned above, it is specifically in this radial direction however that the conductivity would be desired.

The particles are preferably used in micro size, for example the platelets have a width and length in the micrometer range, that is to say for example in the range of 1 to 300 µm, in particular of 1 to 100 µm and particularly preferably of 1 to 40 µm, whereas their diameter in the thickness direction lies in the nanometer range, that is to say between 50 and 1000 nm, in particular in the range of 100 nm to 1000 nm. The spherical particles have for example a diameter in the range of 0.5 to 50 µm, in particular of 1 to 10 µm.

The globular particles are supplied for example in an amount of up to one third of the total amount of particles.

The planar geometry and also the alignment of the filler in the corona shielding perpendicularly to the field loading significantly lengthen the erosion path through the corona shielding in comparison with corona shielding that consists only of globular fillers. For this reason, the amount of spherical particles added to the platelet-like particles has to be selected with the conflicting priorities of increasing the erosion path by having, as far as possible, entirely platelet-like particles and setting an anisotropic conductivity by having globular particles.

According to one embodiment of the method, when mixing the dispersion of particles with the carrier fluid, also added is a functionalizing agent, which is distributed in the carrier fluid and has a mass fraction in the dispersion that corresponds to a predetermined mass ratio relative to the mass fraction of the particles.

Before the mixing of the dispersion, the particles are preferably formed with a substantially monomolecular thin layer on the surface of the particles, the thin layer being produced from a further functionalizing agent. The chemical reaction for coupling the particles takes place between the thin layer and the functionalizing agent.

Alternatively, particles which have a substantially monomolecular thin layer that is different from the thin layer of the particles that are originally present in the dispersion are preferably added to the dispersion of the particles with the substantially monomolecular thin layer and the carrier fluid. The chemical reaction for coupling the particles takes place between two or more different thin layers.

According to a further embodiment of the method, after the removal of the carrier fluid from the sediment there is a further process step, in which energy is introduced into the sediment to overcome the activation energy of the chemical reaction of the functionalizing agent with the particles that forms the particle composite from the sediment, with coupling of the particles via the functionalizing agent, the mass ratio being predetermined in such a way that the particle composite has a porous structure. The coupling of the particles taking such a form intensifies the interactions of the particles with one another, so that the particle composite advantageously has a sufficient strength for producing paper.

The functionalizing agent may be chosen such that it is a plastic, in particular a thermoplastic. The plastic is preferably chosen such that it is a polyolefin alcohol, in particular polyethylene glycol or a not completely hydrolyzed polyvinyl alcohol with a molecular mass of between 1000 and 4000, or a polyalkylsiloxane, in particular methoxy-terminated polydimethylsiloxane, or a silicone polyester. Furthermore, the functionalizing agent is preferably chosen such that it is an alkoxysilane and forms a substantially monomolecular thin layer on the particle surface. The alkoxysilane is preferably chosen such that it comprises epoxy groups, in particular 3-glycidoxypropyltrimethoxysilane, or amino groups, in particular 3-aminopropyltriethoxysilane. Furthermore, the functionalizing agent is preferably chosen such that it comprises particles, in particular nanoparticles of silica, that carry superficial epoxide functionalities.

The method may be carried out such that the energy for overcoming the activation energy is supplied to the sediment with the fabric in the form of heat and/or radiation. Furthermore, the method may be carried out such that the removal of the carrier fluid takes place by filtration and subsequently supplying heat. The removal of the solvent by supplying heat and the supplying of heat to overcome the activation energy can advantageously take place in one method step. In this case, the carrier fluid is preferably chosen such that it is water.

According to one embodiment, the removal of the sediment after adding the fabric takes place by filtration, so that the platelet-like particles are sucked through the fabric.

Introducing the fabric has the effect that a mechanical intermeshing of the sediment with the fabric is produced. This not only simplifies the production process, but also creates a better coupling of the particles to the fabric.

The carrier fluid may be a solvent in which the functionalizing agent is soluble, the functionalizing agent being dissolved in the solvent. The functionalizing agent is preferably chosen such that it forms a substantially monomolecular thin layer on the surface of the particles. The chemical reaction for coupling the particles takes place between the thin layers.

The corona shielding paper may be applied without a backing, that is to say without any reinforcing backing fabric. In that case, embodiments of the present invention may offer the advantage that the backingless composition comprising the electrically conductive paper on the basis of the coated tin oxide particles allows an interface-free attachment of the paper to the main insulation.

The addition of fibers for reinforcement may be set as desired, for example the fibers may be added in an amount of 5 to 50% by weight, providing the possibilities of variation that, with a high fraction of organic fibers, the production of a mechanically stable paper for use as a conductive slot lining of a low-voltage insulating system is made possible, with a resultant increase in the partial-discharge inception voltages (increases in the field at the edges of the sheets are reduced).

Conversely, a low fraction of organic fibers leads to the production of a backingless corona shielding tape, in particular outer corona shielding tape for high-voltage insulating systems.

As an alternative to discrete use, the backingless, conductive paper on the basis of tin oxide particles may be used as a single-sided semiconductive layer of composite materials.

The admixture of globular particles allows different conductivities to be set.

In an embodiment with a woven fabric, for the production of the corona shielding tape a tape may be impregnated in a vacuum-pressure process. As a result, very good attachment of the mica tape winding and the outer corona shielding winding is produced.

In production, the planar particles are aligned, resulting in a lengthening of the erosion path, which prolongs the service life of the insulating system as a whole.

The invention relates to a corona shielding paper for use in a corona shielding system for an electrical machine, for example a high-voltage machine. In the simplest case, the corona shielding paper is produced by compacting planar particles that are resistant to partial discharges and conductive, but may comprise both reinforcing fibers and a woven fabric.

The single FIGURE shows an example corona shielding system 10, installed on an electrical machine 40, e.g., a high-voltage machine, such as a generator for generation of electrical energy, an electric motor, or another piece of electrical equipment having a relatively high rated voltage, e.g., a transformer or a bushing or a cable. The embodiment depicts the corona shielding system 10 including: a corona shielding paper 20 including a polymeric matrix 25, globular filler particles 30, and planar particles 50. The globular particles 30 comprise a mica core 32 surrounded by a electrically conductive coating 34. The electrically conductive coating 34 may comprise at least one ceramic metal oxide. The globular filler particles 30 may be distributed throughout the polymeric matrix 25. The planar particles 50 may comprise a core 52 and a coating 54. In the example of the FIGURE, the corona shielding paper 20 includes reinforcing fibers 22. The electrical machine 40 may include a conductor bar 42 and a lamination stack 44.

What is claimed is:

1. A corona shielding paper, comprising:
   conductive particles including:
   planar particles coated with an electrically conductive coating, and
   globular particles admixed with the planar particles, the globular particles providing a selected anisotropic electrical conductivity,
   wherein the conductive particles have a substantially monomolecular outer surface layer formed from a functionalizing agent, and
   wherein the substantially monomolecular outer surface layers of adjacent conductive particles are coupled to each other by chemical interactions.

2. The corona shielding paper of claim 1, wherein the particles have a core that is resistant to partial discharges, and the electrically conductive coating is resistant to partial discharges.

3. The corona shielding paper of claim 1, further comprising reinforcing fibers in the corona shielding paper.

4. The corona shielding paper of claim 3, wherein the reinforcing fibers have an organic or inorganic basis.

5. The corona shielding paper of claim 1, comprising a woven fabric forming a stabilizing carrier of the corona shielding paper.

6. The corona shielding paper of claim 1, wherein the particles are coated with a metal oxide.

7. The corona shielding paper of claim 1, wherein the particles are coated with a doped metal oxide.

8. The corona shielding paper of claim 1, wherein the substantially monomolecular outer surface layer comprises an alkoxysilane.

9. The corona shielding paper of claim 1, wherein the substantially monomolecular outer surface layer comprises at least one epoxy group or amino group.

10. The corona shielding paper of claim 1, wherein the substantially monomolecular outer surface layer comprises silica nanoparticles.

11. An electric machine, comprising:
a machine body, and
a corona shielding system including a corona shielding paper comprising conductive particles including:
planar particles coated with an electrically conductive coating, and
globular particles admixed with the planar particles, the globular particles providing a selected anisotropic electrical conductivity,
wherein the conductive particles have a substantially monomolecular outer surface layer formed from a functionalizing agent, and
wherein the substantially monomolecular outer surface layers of adjacent conductive particles are coupled to each other by chemical interactions.

12. The electric machine of claim 11, wherein the electric machine is a high-voltage machine.

13. The electric machine of claim 11, wherein the electric machine comprises an electric generator, an electric motor, a transformer, a bushing, or a cable.

14. The electric machine of claim 11, wherein the particles of the corona shielding paper have a core that is resistant to partial discharges, and the electrically conductive coating is resistant to partial discharges.

15. The electric machine of claim 11, further comprising reinforcing fibers in the corona shielding paper.

16. The electric machine of claim 15, wherein the reinforcing fibers have an organic or inorganic basis.

17. The electric machine of claim 11, wherein the corona shielding paper further comprises a woven fabric forming a stabilizing carrier.

18. The electric machine of claim 11, wherein the particles of the corona shielding paper are coated with a metal oxide.

19. The electric machine of claim 11, wherein the particles of the corona shielding paper are coated with a doped metal oxide.

* * * * *